United States Patent
Wunsch et al.

(10) Patent No.: US 11,636,968 B2
(45) Date of Patent: Apr. 25, 2023

(54) MAGNETIC ADJUSTMENT MEMBER FOR MULTI-PHASE INDUCTOR

(71) Applicant: ABB Schweiz AG, Baden (CH)

(72) Inventors: Bernhard Wunsch, Baden-Dättwil (CH); Uwe Drofenik, Zurich (CH); Stanislav Skibin, Nussbaumen (CH); Gernot Riedel, Baden-Rütihof (CH); Ville Samuel Forsstrom, Helsinki (FI)

(73) Assignee: ABB SCHWEIZ AG, Baden (CH)

( * ) Notice: Subject to any disclaimer, the term of this patent is extended or adjusted under 35 U.S.C. 154(b) by 553 days.

(21) Appl. No.: 16/598,155

(22) Filed: Oct. 10, 2019

(65) Prior Publication Data

US 2020/0043642 A1    Feb. 6, 2020

Related U.S. Application Data

(63) Continuation of application No. PCT/EP2018/059148, filed on Apr. 10, 2018.

(30) Foreign Application Priority Data

Apr. 10, 2017  (EP) .................................... 17165720

(51) Int. Cl.
*H01F 17/06*        (2006.01)
*H01F 41/02*        (2006.01)
(Continued)

(52) U.S. Cl.
CPC ........... *H01F 17/062* (2013.01); *H01F 27/28* (2013.01); *H01F 41/0206* (2013.01);
(Continued)

(58) Field of Classification Search
CPC ................................. H01F 17/62; H01F 27/28
(Continued)

(56) References Cited

U.S. PATENT DOCUMENTS 5,731,666 A    3/1998  Folker et al.
6,480,088 B2 *  11/2002  Okamoto ................ H01F 17/04
                                                 336/208
(Continued)

FOREIGN PATENT DOCUMENTS

CN        2602472 Y    2/2004
CN        2632934 Y    8/2004
(Continued)

OTHER PUBLICATIONS

European Patent Office, International Search Report & Written Opinion issued in corresponding Application No. PCT/EP2018/059148, dated Jul. 5, 2018, 14 pp.

*Primary Examiner* — Elvin G Enad
*Assistant Examiner* — Joselito S. Baisa
(74) *Attorney, Agent, or Firm* — Greenberg Traurig, LLP

(57) ABSTRACT

A multi-phase inductor includes a core made of a magnetic material; at least two phase windings surrounding the core for inducing a magnetic field in the core, such that a common mode inductance (LCM) is provided for the at least two phase windings; and an adjustment member made of a magnetic material, which adjustment member has at least two legs, which are interconnected with each other at an inner end and which are touching the core at an outer end to provide a differential mode inductance (LDM) for the at least two phase windings; wherein the outer end of each leg of the adjustment member overlays an axial side of the core and/or each leg of the adjustment member has a varying thickness between the inner end and the outer end to adjust the differential mode inductance (LDM).

15 Claims, 6 Drawing Sheets

(51) Int. Cl.
    *H01F 41/04*     (2006.01)
    *H01F 27/28*     (2006.01)
    *H03H 7/01*     (2006.01)
    *H02M 1/44*     (2007.01)

(52) U.S. Cl.
    CPC ........... *H01F 41/04* (2013.01); *H03H 7/0115* (2013.01); *H02M 1/44* (2013.01)

(58) Field of Classification Search
    USPC ............................................................ 336/5
    See application file for complete search history.

(56) References Cited

U.S. PATENT DOCUMENTS

| | | | | |
|---|---|---|---|---|
| 6,690,257 | B2* | 2/2004 | Kobayashi | H01F 17/062 336/192 |
| 8,618,903 | B2* | 12/2013 | Fornasari | H01F 27/24 336/229 |
| 8,830,021 | B2* | 9/2014 | MacLennan | H01F 27/306 336/178 |
| 8,878,640 | B2* | 11/2014 | Suzuki | H01F 27/2852 336/90 |
| 8,947,187 | B2* | 2/2015 | MacLennan | H01F 27/32 336/58 |
| 2009/0051478 | A1* | 2/2009 | Lee | H01F 3/10 336/212 |
| 2013/0049918 | A1 | 2/2013 | Fu et al. | |

FOREIGN PATENT DOCUMENTS

| | | | |
|---|---|---|---|
| CN | 204424050 | U | 6/2015 |
| CN | 107293389 | A * | 10/2017 |
| EP | 2631920 | A1 | 8/2013 |
| JP | 2000208343 | A * | 7/2000 |
| JP | 2000299235 | A | 10/2000 |
| JP | 2005276995 | A * | 10/2005 |
| JP | 2007300700 | A | 11/2007 |
| JP | 2011003560 | A * | 1/2011 |
| JP | 2013074084 | A * | 4/2013 |
| TW | 200701271 | A | 1/2007 |
| WO | 2009131602 | A1 | 10/2009 |

\* cited by examiner

MAGNETIC ADJUSTMENT MEMBER FOR MULTI-PHASE INDUCTOR

FIELD OF THE INVENTION

The invention relates to a multi-phase inductor, a use of an adjustment member for the multi-phase inductor and a method for adjusting a differential mode inductance of the multi-phase inductor with an adjustment member.

BACKGROUND OF THE INVENTION

A converter connected to a low voltage grid usually has to fulfil an EMI norm and an EMI filter has to be part of the converter. Besides fulfilling all required norms, the EMI filter should be optimized for low losses and/or low size and/or minimum cost. Typically, an EMI filter is a bulky component group which significantly contributes to size and cost of a converter.

An EMI filter usually comprises capacitors and inductors, which are selected and interconnected for filtering noise of the converter. For example, a multi-phase inductor may be used as EMI filter between the converter and the electrical grid. A multi-phase inductor has several windings, which are provided on a core. For filtering common mode noise, the multi-phase inductor provides a common mode inductance, i.e. an inductance between currents that flow parallel with respect to each other through the windings. Furthermore, a differential mode inductance, i.e. an inductance between currents that flow antiparallel, is present, that usually is substantially smaller than the common mode inductance. A present differential mode inductance may help to reduce the size of capacitors, since with an increased differential mode inductance, the capacitance of the EMI filter may be decreased.

If the differential model inductance is not large enough, the required size and cost of the capacitors becomes higher. One solution for this is to add an additional dedicated differential mode inductor in series with the common mode inductance. However, such an additional component may significantly increase manufacturing effort, costs and filter volume.

Furthermore, it is known that the differential mode inductance may be increased by interconnecting parts of the magnetic core between the windings of the EMI filter with each other.

For example, WO 2009 131 602 A1 shows a common mode, differential mode three-phase inductor, which includes common mode and differential mode flux paths provided in a complicated formed inductor core.

US 2013 0 049 918 A1 shows a common mode choke with a magnetic plate, which is inserted within an inner circumference of a magnetic core to provide a differential mode inductance. The inductance value of the differential mode inductance can be changed by adjusting either the gap between the magnetic plate and the magnetic core or the thickness of the magnetic plate.

US 2009/051 478 A1 shows a conducting element that may be pushed into a toroidal core. Also, two parts elements, which are pushed in a core are discussed.

CN 2 602 472 Y and JP 2000 299 235 A show toroidal cores with an intermediate element through the center of the core. The intermediate elements are a part of the core.

CN 2 632 934 Y and TW 200 701 271 A show a toroidal core, with an intermediate element through the center of the core.

CN 204 424 050 U shows a toroidal core and a three-leg member that is provided inside a center opening of the core.

DESCRIPTION OF THE INVENTION

It is an objective of the invention to provide a simple, small and economic EMI filter for a converter. It is a further objective of the invention to provide a simple way for adjusting the differential mode inductance of a multi-phase inductor.

These objectives are achieved by the subject-matter of the independent claims. Further exemplary embodiments are evident from the dependent claims and the following description.

An aspect of the invention relates to a multi-phase inductor. For example, the inductor may be employed in an EMI filter, which may be used for interconnecting a converter with an electrical grid. For each phase, the inductor may comprise a phase winding, which phase windings may be inductively coupled with each other. The EMI filter furthermore may comprise capacitors, which are interconnected between the phases in front of and/or behind the multi-phase inductor.

According to an embodiment of the invention, the inductor comprises a toroidal core made of a magnetic material and at least two phase windings surrounding the core for inducing a magnetic field in the core, such that a common mode inductance is provided for the at least two phase windings.

The core may have the shape of a ring around which the phase windings are wound. The ring may be circular but also may have other more irregular forms. It has to be noted that a toroid and/or ring defines an axial direction, which is orthogonal to an extension plane of the toroid and/or ring, radial directions, which run through a center of the toroid and/or ring in the extension plane and a circumferential direction, running around the center in the extension plane. In particular, all these directions may be defined with respect to a middle axis of the toroid and/or ring.

The core may be one piece or may be composed of more than one member. The phase windings may be wound around the core in the same winding direction, such that parallel currents in the phase windings generate magnetic fields of the same direction in the core. Furthermore, the phase windings may have the same shape and/or may be equally distributed along the core. Two neighboring phase windings may be spaced apart, such that a gap is present between the phase windings, in which gap the core is not covered by a phase winding.

The multi-phase inductor may comprise two phases, three phases or more. For example, a two phase inductor may be used in a single phase converter system, wherein the two phases of the inductor are used for phase and neutral. A three-phase inductor may be used in a three-phase converter system with three phases adding up substantially to zero.

A magnetic material may be any material that has a magnetic permeability much higher than that of vacuum (by a factor of more than 10 or more than 100).

The multi-phase inductor furthermore comprises an adjustment member made of a magnetic material, which adjustment member has at least two legs, which are interconnected with each other at an inner end and which are touching the core at an outer end between the phase windings to provide a differential mode inductance for the at least two phase windings.

The legs may touch the core at gaps between the phase windings. It has to be noted that the magnetic material of the adjustment member may not be in direct contact with the core. There may be a gap between the magnetic material of the core and the adjustment member. The adjustment member and/or the core are coated with a non-magnetic material, which may generate such a gap. However, the adjustment member and the core may be in direct contact, for example via the coating and/or the adjustment member may be attached to the core by gluing or by friction forces. A non-magnetic material may be an electrically isolating material.

For example, in the case of more than two phases the adjustment member may be star-shaped. The legs may start at an inner end at a central axis, which also may be the axis of the core and/or may run in a radial direction until they touch the core.

The magnetic adjustment member may reduce a magnetic coupling between different windings in a defined way and/or may increase a differential mode inductance of the multi-phase inductor.

The magnetic properties of the adjustment member may be adjusted with the interface surface between the adjustment member and the core and a thickness of the legs. The design of the interface surface between the end of the leg and the core may control the air gap reluctance and/or the magnetic flux through the interface surface. The differential mode inductance of the multi-phase inductor may be related to the magnetic flux through the interface surface and/or the legs.

Furthermore, the outer end of a leg or of each leg is formed as a foot of increasing thickness in circumferential direction, which becomes thicker in circumferential direction with increasing distance to a middle axis, which foot has a radial outer side formed like a radial inner side of the core. The radial inner side of the core faces the middle axis, the radial outer side of the foot points away from the middle axis and/or is directed towards the radial inner side of the core. In such a way, an interface surface between the adjustment member and the core may be increased. This may reduce a gap reluctance and/or may increase a magnetic flux through the interface surface. According to an embodiment of the invention, the outer end of each leg of the adjustment member overlays an axial side of the core, in particular for adjusting the air gap reluctance and/or to adjust the differential mode inductance. When the outer ends of the legs are not attached to the inner side of the core but to one or two of its axial sides, a gap between the core and adjustment member may be made very small and/or may not depend on varying sizes of the adjustment member, which for example may be caused due to thermal expansion and/or due to manufacturing tolerances. In such a way, the magnetic resistance may be adjusted more exactly than with other type of interface surfaces.

An axial side of the core may be a side facing in an axial direction of the core. Contrary to this a radial inner side and a radial outer side of the core may be a side facing in a radial direction of the core. The outer ends of the legs may overlay the core, when an inner radius of the core is smaller than an outer radius of the adjustment member.

According to an embodiment of the invention, each leg of the adjustment member has a varying thickness between the inner end and the outer end, in particular to adjust the differential mode inductance. The thickness of a leg may define a cross-sectional area of the adjustment member through which a magnetic flux between the ends is conducted. When this area is decreased along each leg, the magnetic flux may be decreased.

A varying thickness may mean that each leg provides differently sized cross-sectional areas along an extension direction of the leg. In particular, each leg may become thinner between the ends and/or one end may be thicker as the other end. A varying thickness of the legs may have several advantages.

Additionally, the mechanical properties of the adjustment member may depend on the thickness of the legs. Thicker ends may enhance the stability of the adjustment member. For example, thicker inner ends may reduce the risk of breaking the adjustment member, when arms are subjected to forces at their outer ends. Such forces may be caused by pressing the adjustment member into the core and/or by a varying inner radius of the core, when it heats and cools down.

Furthermore, a thinner part of a leg may enable a magnetic saturation of the magnetic material of the adjustment member before the core saturates. In case of high current peaks of the differential mode current, this thinner part of the magnetic path may go into a controlled saturation. This may disable the magnetic path and may reduce the differential mode inductance significantly, but at the same time prevents saturation of the core. Therefore, a thinner part may prevent reduction of the common mode inductance and/or prevent an increase of the common mode current in the case of high differential mode current peaks. This behavior in case of unusual differential mode current peaks may prevent an undesired peak in the common mode current which, for example, may trip earth leakage protection devices and might affect safety.

Such a magnetic adjustment member may be a flexible and low-cost solution, which does not increase a volume of an EMI filter. The filter capacitor values may be reduced and/or an additional differential mode inductance is not required any more (or at least of much smaller size).

In the end, standard cores may be provided with the adjustment member to achieve the above mentioned beneficial properties. The core needs not to be modified. In particular, cores of monocrystalline magnetic material may be used, for which modifications in shape may be difficult and/or expensive.

According to an embodiment of the invention, each leg has one or more flanges at the outer end, which flanges are attached to one or two axial side of the core. A geometric shape of the outer end of each leg may form a flange-like structure, which partly envelopes the core. One or two flanges may protrude from a foot and/or outer end of the corresponding leg. Also flanges may increase the interface surface between the adjustment member and the core. Furthermore, the flanges may fixate the adjustment member with respect to the core.

According to an embodiment of the invention, the inner end of each leg is thicker than an outer end of the leg, the outer end of each leg is thicker than an inner end of the leg and/or the inner and or the outer end of a leg are thicker than a middle part of the leg. Due to reasons of mechanical stability, it may be beneficial, when the outer ends and an inner part of the adjustment member composed of the inner ends of the legs are thicker than middle parts of the legs. Furthermore, thinner middle parts of the adjustment member may allow a controlled saturation of the magnetic path through a leg in case of unusual peaks in the differential mode current. In such a way, the adjustment member may operate as a magnetic fuse. It also may be that the middle part of the leg has a continuous increasing thickness.

The thickness of a leg may be determined in an axial direction and/or in a circumferential direction of the adjustment member. The thickness of a leg also may be defined as a diameter of a cross-section of the leg. It has to be noted that the adjustment member may have a constant thickness in one direction, such as the axial direction and the legs may have a varying thickness in another direction, such as the circumferential direction.

According to an embodiment of the invention, the outer end of each leg has a larger contact area to the core as compared to a cross section in circumferential direction of the inner end of each leg, for example by at least 10%. The outer end of each leg may be formed like a foot that becomes thicker with increasing distance to a middle axis and/or with increasing radius.

A cross section in circumferential direction may be defined as a cross section of the respective component with a cylinder around the middle axis of the toroidal core at a specific radial distance from the middle axis.

According to an embodiment of the invention, each leg has a middle part of constant thickness. For example, the leg may have a substantially rectangular cross-section in the middle part.

According to an embodiment of the invention, a thickness of the adjustment member is equal to a thickness of the core in an axial direction of the core. It may be that the adjustment member may have the same thickness in this direction.

According to an embodiment of the invention, the adjustment member is provided in two parts that are pluggable into a middle opening formed within the core from two axial directions. The two parts may be minor-symmetric with respect to each other. Each of the two parts may have flanges that protrude over an axial side of the core. When the two parts are fixated to each other in the middle opening, the flanges may keep the adjustment member in the opening. For example, the two parts may be glued to each other.

According to an embodiment of the invention, the adjustment member is provided in one part that is pluggable into a middle opening formed within the core. It also may be possible that the adjustment member is one piece. Also in this case, the adjustment member may have flanges on one side.

According to an embodiment of the invention, the adjustment member comprise (or is made of) one or two flat members attached to one or two axial sides of the core. In this case, the two flat members need not touch each other. Each flat member may be a substantially two-dimensional structure. One flat member may be provided on an outer axial side of the multi-phase inductor. Two flat members may be provided on two opposite axial sides of the multi-phase inductor. A middle opening inside the core may stay empty.

According to an embodiment of the invention, the inner ends of the adjustment member are arranged in a middle opening within the core. In this case, the middle opening of the core may be used to accommodate all or substantially all of the adjustment member, which may save space.

According to an embodiment of the invention, the adjustment member is made of a magnetic material with a different magnetic conductivity as the core. With the choice of the magnetic material and its permeability, the differential mode inductance and/or the saturation point of the adjustment member may be adjusted.

According to an embodiment of the invention, the adjustment member has an electrically isolating outer layer. For example, the adjustment member may be provided with an electrically isolating and/or non-magnetic coating. An electrically insulating layer may galvanically separate the phase windings and/or may guarantee creepage and clearance distances.

According to an embodiment of the invention, the adjustment member comprises a plastic housing, in which the magnetic material of the adjustment member is accommodated. For example, the adjustment member may comprise a plastic housing containing pressed magnetic powder. The plastic wall may define an air gap between the core and the outer ends of the legs. Furthermore, the elasticity of the plastic housing may allow to press fit the magnetic adjustment member into the core.

According to an embodiment of the invention, the inductor comprises (solely) two opposite windings and the adjustment member comprises (solely) two legs, which have outer ends facing towards opposite sides of the core. Such an inductor may be used for single-phase applications. When the adjustment member has only two legs, these legs may be arranged with an angle of 180° with respect to each other.

According to an embodiment of the invention, the inductor comprises (exactly) three symmetrically aligned windings and the adjustment member comprises three symmetrically arranged legs. Such an adjustment member may be rotational symmetric to its middle axis. The legs may be arranged with an angle of 120° with respect to each other.

A further aspect of the invention relates to a use of an adjustment member as described in the above and in the following, for adjusting a differential mode inductance of a multi-phase inductor, wherein the adjustment member is made of a magnetic material, which adjustment member has at least two legs, which are interconnected with each other at an inner end and which are touching the core at an outer end to provide a differential mode inductance for the at least two phase windings, and wherein the outer end of each leg of the adjustment member overlays an axial side of the core and/or each leg of the adjustment member has a varying thickness between the inner end and the outer end to adjust the differential mode inductance.

With a separate adjustment member, a standard inductance may be adjusted to the desired differential mode inductance. Furthermore, when the adjustment member is designed with ends overlaying the core at an axial side and/or with legs with varying thickness, the requirements of the adjustment member with respect to magnetic conductivity, controlled saturation, air gap reluctance and mechanical stability may be met.

A further aspect of the invention relates to a method of adjusting a differential mode inductance of multi-phase inductor. The method may be performed during manufacturing of the multi-phase inductor as described in the above and in the following.

According to an embodiment of the invention, the method comprises: providing a core made of a magnetic material, wherein at least two phase windings surround the core for inducing a magnetic field in the core, such that a common mode inductance is provided for the at least two phase windings; providing several adjustment members made of a magnetic material, each adjustment member having at least two legs, which are interconnected with each other at an inner end and which are adapted for touching the core at an outer end to provide a differential mode inductance for the at least two phase windings, wherein the adjustment member and/or the core are coated with a non-magnetic material generating a gap between the magnetic material of the core and the adjustment member, wherein the outer end of a leg is formed as a foot of increasing thickness in circumferential direction, which becomes thicker with increasing distance to a middle axis, which foot has a radial outer side formed like a radial inner side of the core, and wherein legs of different adjustment members have different thicknesses in circumferential direction; selecting one of the several adjustment members to select a differential mode inductance; and attaching the selected adjustment member to the core.

During manufacturing a standard core with windings may be provided with a selected magnetic adjustment member that generates the desired differential mode inductance for the application, in which the multi-phase inductor is employed. The magnetic adjustment members may be provided in a set of different sizes and/or forms. The outer dimensions of the magnet adjustment members may be supposed to fit with a maximum number of core geometries available on the market.

It has to be understood that features of the method and the use as described in the above and in the following may be features of the multi-phase inductor as described in the above and in the following, and vice versa.

These and other aspects of the invention will be apparent from and elucidated with reference to the embodiments described hereinafter.

BRIEF DESCRIPTION OF THE DRAWINGS

The subject-matter of the invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

DETAILED DESCRIPTION OF EXEMPLARY EMBODIMENTS

Figure 1:
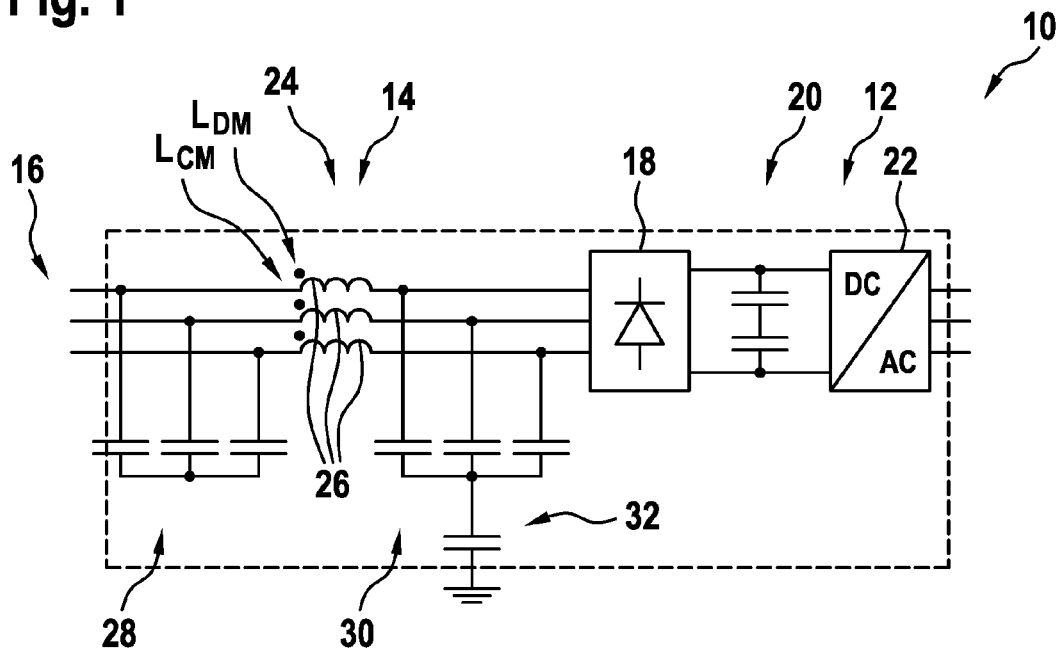
FIG. 1 schematically shows a circuit diagram of a drive system with a multi-phase inductor according to an embodiment of the invention.

FIG. 1 shows a drive system 10, which comprises a converter 12 and an EMI filter 14. A three-phase AC current from an electrical grid 16 passes through the EMI filter 14 and is converted by the converter 12 into an output AC current of a different frequency, which may be supplied to an electrical motor. The EMI filter 14 may filter noise generated by the converter 12 and noise from the electrical grid 16.

The converter 12 may be any kind of converter. In the embodiment of FIG. 1 it comprises a rectifier 18, a DC link 20 and an inverter 22.

The EMI filter 14 comprises a three-phase inductor 24, which comprises three-phase windings 26 for conducting the phase currents that are inductively coupled. On an input side, the EMI filter 14 comprises three capacitors 28, which are delta-connected between the phases. On an output side, the EMI filter 14 comprises three capacitors 30, which are delta-connected between the phases and which are connected to a neutral point via a further capacitor 32.

The three-phase inductor 24, due to the magnetic coupling of the three-phase windings 26, has a common mode inductance $L_{CM}$. Due to its non-ideal magnetic coupling k<1 it has a differential mode inductance $L_{DM}$. A common mode inductance may inductively couple phase currents flowing through the three-phase inductor 24 in the same direction. A differential mode inductance may inductively couple phase currents flowing through the three-phase inductor 24 in opposite direction.

For conventional three-phase inductors 24, the differential mode inductance $L_{DM}$ is usually about two orders of magnitude smaller than the common-mode inductance $L_{CM}$. Generally, both inductances, $L_{CM}$ and $L_{DM}$, are required for filtering. For example, with a typical value of the magnetic coupling k=0.99, this results in $L_{DM}=(1-k)*L_{CM}=0.01*L_{CM}$. The differential mode current is typically about 1-2 orders of magnitude larger than the common mode current. To get the required attenuation of the EMI filter 14, the capacity of the capacitors 28, 30 has to be chosen, such that a desired for common mode filtering and differential mode filtering is achieved. When the common mode inductance of the three-phase inductor is higher, then the capacities may be chosen smaller. So, when it is possible to increase the differential mode inductance of a three-phase inductor 24 in an easy way, the capacitors may be chosen smaller and the whole EMI filer 14 may be designed cheaper and smaller.

It has to be noted that for a two-phase system (which may be seen as single phase system, since it only has one phase at potential) or systems with more than three phases, corresponding multi-phase EMI filters with more and less phases may be employed. In these cases, the inductor 24 may be a two-phase or in general a multi-phase inductor 24.

Figure 2:
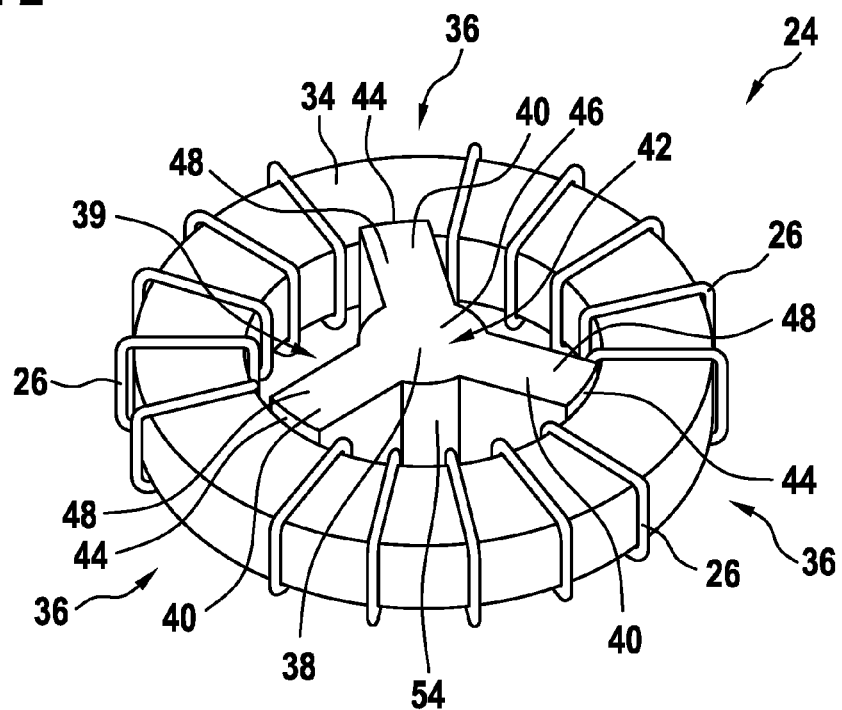
FIG. 2 schematically shows a perspective view of a multi-phase inductor.

FIG. 2 shows an embodiment of a multi-phase inductor 24, with three-phase windings 26, which are wound around a core 34. The core 34 may be a circular ring with rectangular cross-section.

The phase windings 26 are wound in the same direction to induce a magnetic field in the same direction for a common mode current. In FIG. 2, the phase windings 26 are indicated with some conductor loops. In the following drawings, the phase windings only are indicated with boxes surrounding the core 34.

The phase windings 26 have the same size and/or are arranged spaced apart from each other around the core in a regular way. Between the phase windings 26, a circumferential part 36 of the core 34 remains uncovered by the phase windings 26.

FIG. 2 shows a first embodiment of a magnetic adjustment member 38 for increasing the differential mode inductance $L_{DM}$ of the inductor 24, which is put into an opening 39 within the core 34.

The adjustment member 38 is made of magnetic material so that it increases the magnetic stray flux of the core 34.

This results in a defined increase of the differential mode inductance $L_{DM}$. The magnetic adjustment member 38 may reduce the magnetic coupling $L_{CM}$ in a defined way and/or may increase a related (parasitic) differential mode inductance $L_{DM}$ in a defined way. A core 34 with phase windings 26 may be employed with the adjustment member 38 without modification. Employing this simple, flexible and low-cost solution, which needs not increase the volume of the EMI filter 14, the filter capacitor values can be reduced and/or an additional differential mode inductance is not required any more.

The adjustment member 38 has three legs 40, which are joined at inner ends 42 and which are touching the core 34 with outer ends 44 in the circumferential parts 36 not covered by the phase windings 26.

The adjustment member 38 has a uniform thickness in an axial direction of the multi-phase inductor 24, which direction also may be the axis direction of the core 34. In the embodiment of FIG. 2, the axial thickness of the adjustment member 38 may be substantially equal to the axial thickness of the core 34. However, in a circumferential direction, i.e. a direction along the core 34, the thickness of the legs 40 is varying with respect to different radiuses from the axis.

The inner ends 42 of the legs 40 are joined to form a substantial circular center part 46 of the adjustment member 38. At the center part 46, the inner ends 42 have an increasing thickness. A middle part 48 of the legs 40 and the outer ends 44 has a constant thickness in the circumferential direction.

A shown in FIG. 2, an air gap 50 may be present between the inner side of the core 34 and the outer ends 44. The air gap 50 may be tuned, such as to prevent saturation by the differential mode current. The adjustment member 38 and/or the core 34 may be coated with a non-magnetic coating 54. It also may be that the adjustment member 38 has a plastic housing 56 (see FIG. 3). The thickness of the air gap 50 may be adjusted with a thickness of the coating 54 of the adjustment member 38 and/or the plastics housing 56. The coating 54 and/or housing 56 may be used for providing flexibility, when the adjustment member is pressed into the core 34.

With an insulating coating and/or housing, the adjustment member 38 also may electrically separate the phase windings 26 and/or may guarantee creepage and clearance distances.

For example, the adjustment member 38 may be made from a plastic housing with pressed magnetic power inside, and sealed afterwards. The pressure during the manufacturing may define the relative permeability and/or may allow high design flexibility. Such powders come typically with magnetic permeability in ranges 10-100 and saturation flux densities above one Tesla, and may be suited for forming an adjustment member 38 for providing a beneficial differential mode inductance $L_{DM}$.

FIG. 4 to 8 show that the middle part 48 of each leg of the adjustment member 38 may be reduced in thickness, which reduces the magnetic thickness of the stray paths to the center part 46 of the adjustment member 38. This may allow an operation of the adjustment member 38 as magnetic fuse, i.e. with the thickness of the middle part, a magnetic saturation at specific common mode currents may be set.

Figure 4:
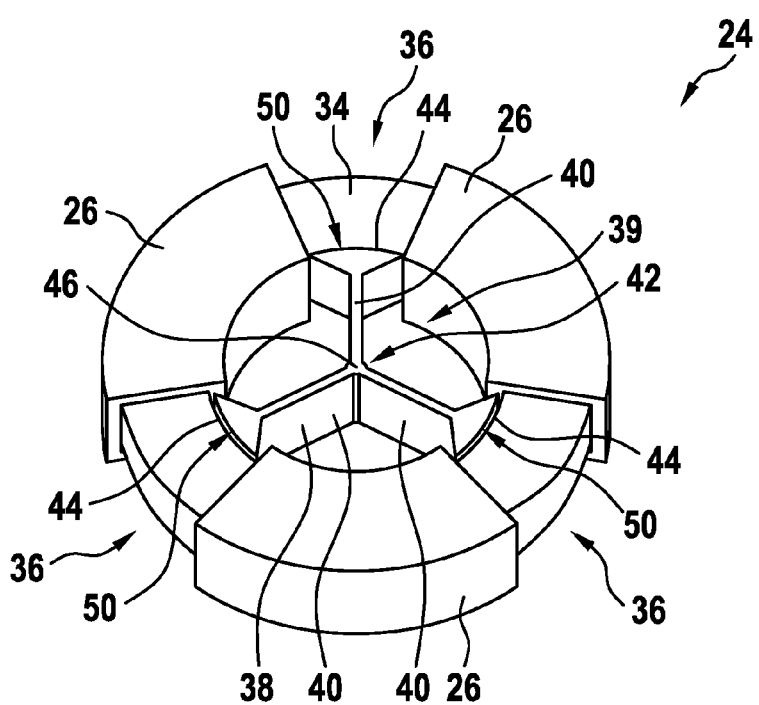
FIG. 4 schematically shows a perspective view of a multi-phase inductor according to an embodiment of the invention.

In FIG. 4, the adjustment member has a uniform thickness in axial direction, which is substantially the thickness of the core 34 in this direction. The middle part 48 of each leg 40 has a uniform but smaller thickness as the outer ends 44 in circumferential direction.

The outer ends 44 are formed as foots, i.e. with increasing thickness, when coming closer to the core. Furthermore, the radial outer sides of the outer ends 44 facing a radial inner side of the core 34 are formed corresponding to the core 34. This special shape of the interface between the outer ends 44 and the core 34 may increase the contact surface between the adjustment member 38 and the core 34. This may reduce the air gap reluctance and/or may allow a further increase of the stray flux through the adjustment member 38.

Figure 5:
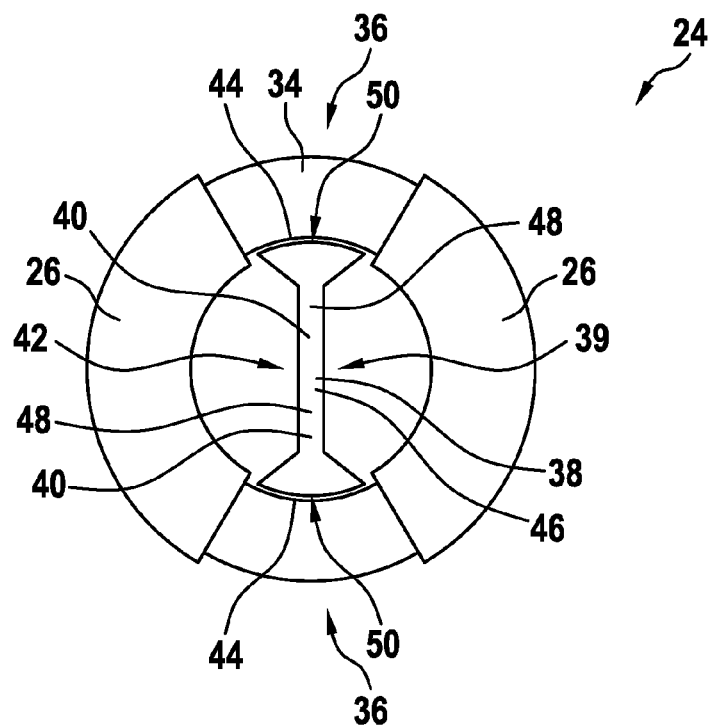
FIG. 5 schematically shows a top view of a multi-phase inductor according to an embodiment of the invention.

FIG. 5 shows an embodiment with only two phase windings 26, i.e. for a two-phase inductor 34. In this case, the adjustment member 38 may only have two legs 40. However, the legs 40 of the adjustment member 38 may be formed like the legs of the embodiments shown in the other drawings. In the embodiment of FIG. 5, the legs 40 are formed like the legs 40 as shown in FIG. 4.

Figure 3:
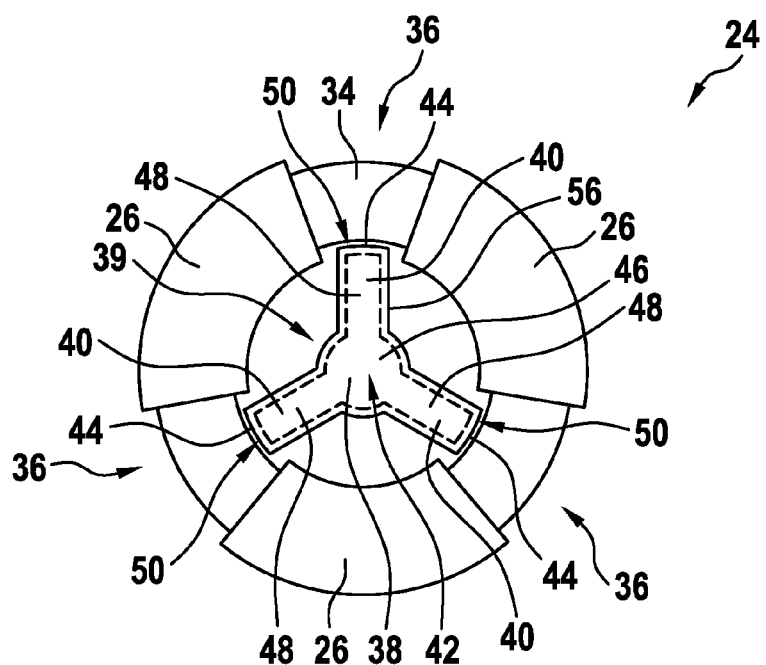
FIG. 3 schematically shows a top view of a multi-phase inductor.

The embodiments of the adjustment member 38 shown in FIG. 2 to 4 are completely accommodated in the opening 39 inside the core 34. For example, they may be put in the opening 39 and may be attached there via gluing or friction fit.

Figure 6:
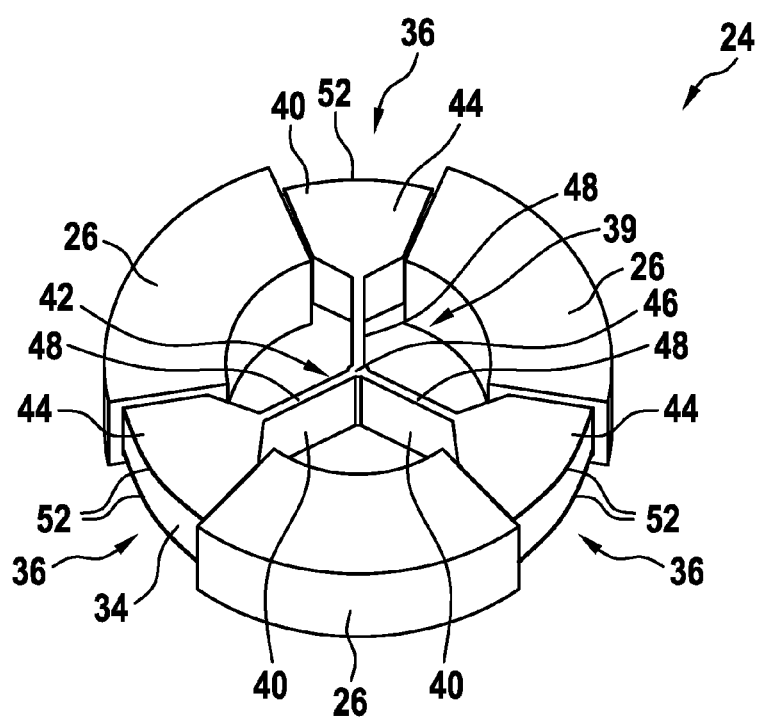
FIG. 6 schematically shows a perspective view of a multi-phase inductor according to a further embodiment of the invention.
Figure 7:
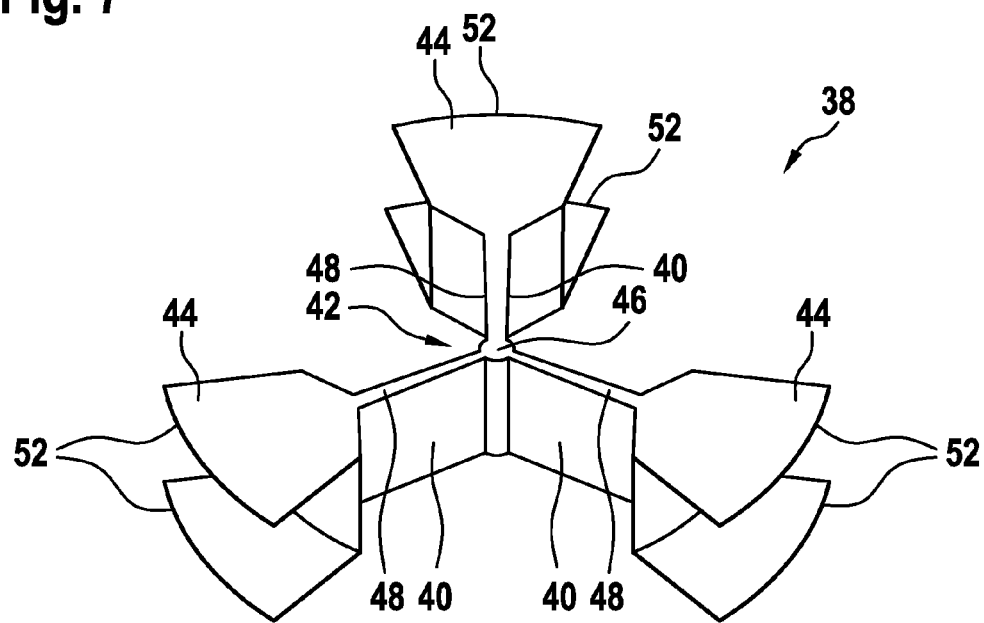
FIG. 7 schematically shows a perspective view of an adjustment member for a multi-phase inductor according to a further embodiment of the invention.
Figure 8:
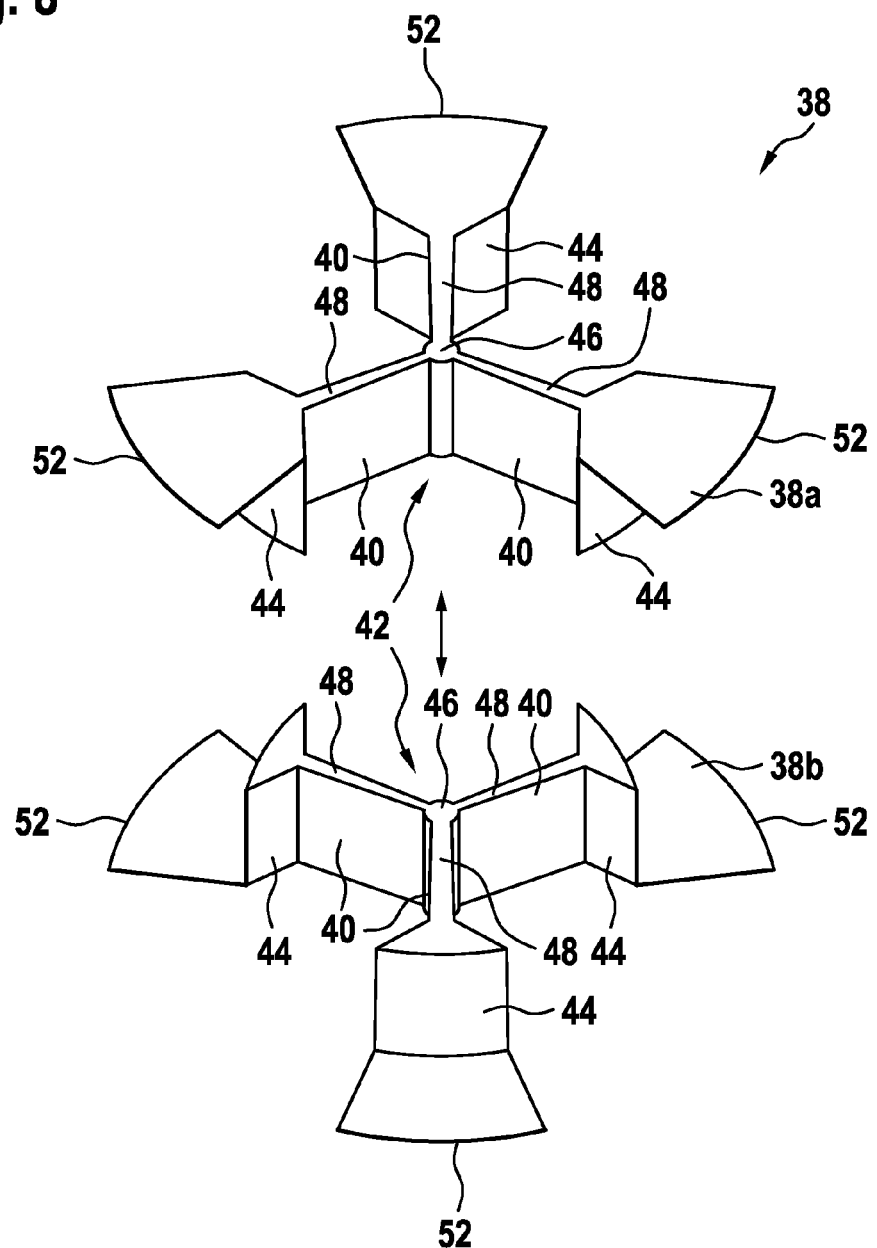
FIG. 8 schematically shows a perspective view of a two-part adjustment member for a multi-phase inductor according to a further embodiment of the invention.

The adjustment members 38 of FIG. 6 to 8 may be formed radially inside the opening 39 like the embodiments as shown in FIG. 2 to 5 and actually are formed there like the embodiment of FIG. 4. However, the embodiments of FIG. 6 to 7 have flanges 52 that may support the reduction of the air gap 50 and/or that may help attaching the adjustment member 38 to the core 34.

The adjustment member of FIG. 6 is separately shown in FIG. 7. The outer ends 44 of the legs 40 are provided with flanges 52 at axial opposite sides, which embrace the core 34. Each flange may be a substantially flat body that protrudes radially outwards from axial outer sides of the outer ends 44.

The flanges 52 may partly envelope the core 34. In particular, they may nearly completely envelope the radial inner side and the axial sides of the circumferential parts 36 of the core 34, which are not covered by the phase windings 26.

FIG. 8 shows that the adjustment member 38 of FIG. 7 may be made of two parts 38a, 38b, which may be mirror-symmetric with respect to a middle plane. The two parts may be put in the opening 39 and may be glued together. Then the flanges 52 keep the adjustment member 38 in the opening 39.

Figure 9:
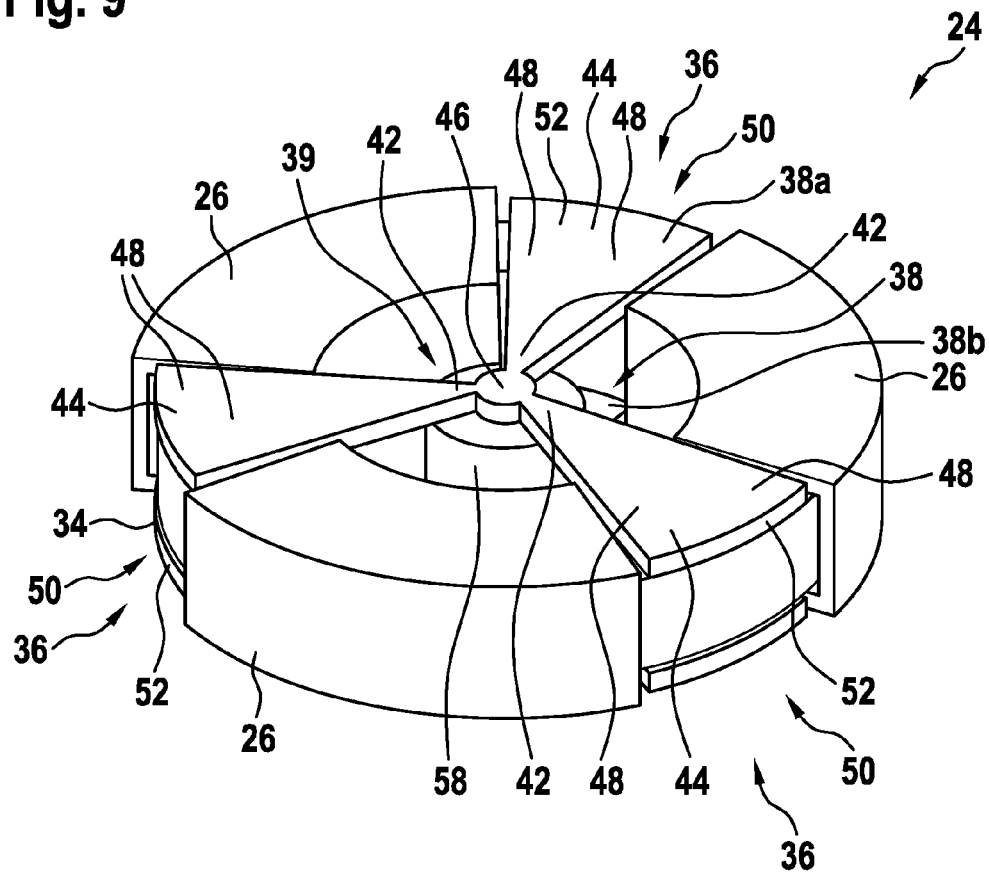
FIG. 9 schematically shows a perspective view of an adjustment member for a multi-phase inductor.

FIG. 9 shows a further embodiment of an adjustment member 38 that is composed of two flat adjustment member parts 38a, 38b that are attached to axial sides of the core 34. It has to be noted that also only one of the adjustment member parts 38a, 38b may be used as adjustment member alone.

Each adjustment member part 38a, 38b is a two-dimensional magnetic structure and/or plate attached to the core 34. This may be very simple and easy to realize. For example, each adjustment member part 38a, 38b may be attached by gluing. In the case of FIG. 9, a small controlled air gap may be achieved between the core 34 and the adjustment member parts 38a, 38b, which is insensitive to variations in the radius of the core 34. Such an air gap 50 also may be achieved with the flanges 52 of FIG. 6 to 8.

Each adjustment member part 38a, 38b has legs 40 with an inner end 42 and an outer end 44. The outer ends 44 may be seen as flanges 52. Furthermore, the legs 40 may become thinner in circumferential direction between the outer ends 44 and the inner ends 42. Also a circular central part 46 may be provided, which may be seen as composed by the inner ends 42.

A spacer 58 may be provided between the adjustment member parts 38a, 38b, which spacer 58 may mechanical support the adjustment member parts 38a, 38b. For example, the spacer 58 may be made of plastics and/or may have a cylindrical shape. The spacer 58 may be arranged inside the opening 39 and/or in the center of the opening 39 and/or between the central parts 46.

The embodiment of the FIG. 9 may have the further advantage that the opening 39 inside the radial core 34 within the opening 39 is not occluded by the adjustment member 38 such that convection cooling may take place.

Figure 10:
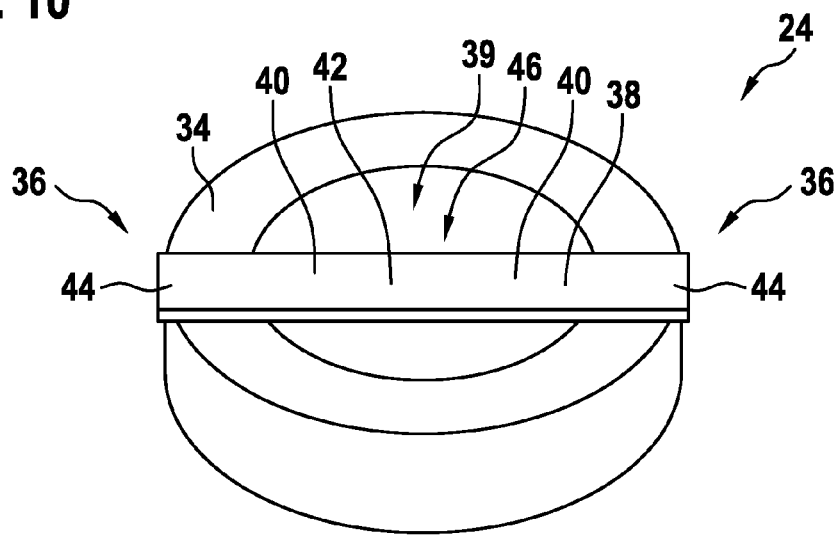
FIG. 10 schematically shows a perspective view of an adjustment member for a multi-phase inductor.

FIG. 10 shows a further embodiment of a flat adjustment member 38, which may be designed like a rod or plate. In FIG. 10, the phase windings have been omitted. In general, the core 34 of FIG. 10 may be provided with two phase windings as shown in FIG. 5.

The flat adjustment member 38 of FIG. 10, is attached to axial sides of the core 34 with its outer ends 44. It has to be noted that also two adjustment members 38 may be used as adjustment member parts, which may be arranged on opposite sides of the core 34.

All embodiments of an inductor 24 may be made by providing a core 34, which may be a standard core 34 that already may be provided with the phase windings 26.

Furthermore, several types of adjustment members 38 may be provided, which are adjusted to different cores 34 and/or to different desired differential mode inductances $L_{DM}$. Since a standard core 34 may be provided in different sizes (especially its inner radius), the adjustment members 38 also may be provided in different sizes. Furthermore, types of adjustment members 38 of the same size may be provided with legs 40 of different thicknesses and/or different magnetic material.

In such a way, one of the several adjustment members 38 may be selected to select a specific differential mode inductance $L_{DM}$ and the selected adjustment member 38 may be attached to the standard core 34.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS 10 drive system
12 converter
14 EMI filter
16 electrical grid
18 rectifier
20 DC link
22 inverter
24 multi-phase inductor
$L_{CM}$ common mode inductance
$L_{DM}$ differential mode inductance
26 phase winding
28 filter capacitor
30 filter capacitor
32 filter capacitor
34 core
36 circumferential part
38 adjustment member
38a first adjustment member part
38b second adjustment member part
39 opening
40 leg
42 inner end
44 outer end
46 center part
48 middle part
52 air gap
54 flange
54 non-magnetic coating
56 housing
58 spacer

The invention claimed is:

1. A multi-phase inductor, comprising:
a toroidal core made of a magnetic material;
at least two phase windings surrounding the core for inducing a magnetic field in the core, such that a common mode inductance is provided for the at least two phase windings; and
an adjustment member in a middle opening within the toroidal core, the adjustment member made of a magnetic material, which adjustment member has at least two legs, which are interconnected with each other at an inner end and which are touching the core at an outer end between the phase windings to provide a differential mode inductance for the at least two phase windings;
wherein the adjustment member and/or the core are coated with a non-magnetic material generating a gap between the magnetic material of the core and the adjustment member;
wherein the outer end of a leg is formed as a foot of increasing thickness in circumferential direction of the toroidal core, which becomes thicker with increasing distance to a middle axis of the toroidal core, which foot has a radial outer side formed like a radial inner side of the core;
wherein each leg has two flanges at the outer end, which flanges are attached to axial sides of the toroidal core, the axial sides facing in an axis direction of the toroidal core, wherein the flanges envelope a radial inner side and the axial sides of circumferential parts of the core, which are not covered by the phase windings, such that the outer end of each leg of the adjustment member overlays an axial side of the axial sides of the core for adjusting the differential mode inductance; and
wherein the adjustment member is provided in two parts that are pluggable along the axis direction into the middle opening within the core.

2. The inductor of claim 1, wherein the outer end of each leg has a larger contact area to the core as compared to a cross section in circumferential direction of the inner end of each leg.

3. The inductor of claim 2, wherein the outer end of each leg of the adjustment member overlays an axial side of the core.

4. The inductor of claim 2, wherein each leg has a middle part of constant cross-section in circumferential direction.

5. The inductor of claim 2, wherein a thickness of the adjustment member in an axial direction is equal to a thickness of the core in the axial direction.

6. The inductor of claim 1, wherein each leg has a middle part of constant cross-section in circumferential direction.

7. The inductor of claim 1, wherein a thickness of the adjustment member in an axial direction is equal to a thickness of the core in the axial direction.

8. The inductor of claim 1, wherein the adjustment member is made of a magnetic material with a different magnetic conductivity as the core.

9. The inductor of claim 1, wherein the adjustment member has an electrically isolating outer layer.

10. The inductor of claim 1, wherein the adjustment member comprises a plastic housing, in which the magnetic material of the adjustment member is accommodated.

11. The inductor of claim 1, wherein the at least two windings of the inductor comprise two opposite windings and the at least two legs of the adjustment member comprise two legs, which have outer ends facing towards opposite sides of the core.

12. The inductor of claim 1, wherein the at least two windings of the inductor are three symmetrically aligned windings and the at least two legs of the adjustment member are three symmetrically arranged legs.

13. The inductor of claim 1, wherein each leg has a middle part of constant cross-section in circumferential direction.

14. The inductor of claim 1, wherein a thickness of the adjustment member in an axial direction is equal to a thickness of the core in the axial direction.

15. A method of adjusting a differential mode inductance of a multi-phase inductor, the method comprising:
   providing a toroidal core made of a magnetic material, wherein at least two phase windings surround the core for inducing a magnetic field in the core, such that a common mode inductance is provided for the at least two phase windings;
   providing several adjustment members made of a magnetic material, each adjustment member having at least two legs, which are interconnected with each other at an inner end and which are adapted for touching the core at an outer end between the phase windings to provide a differential mode inductance for the at least two phase windings, wherein the adjustment member and/or the core are coated with a non-magnetic material generating a gap between the magnetic material of the core and the adjustment member, wherein the outer end of a leg is formed as a foot of increasing thickness in circumferential direction of the toroidal core, which becomes thicker with increasing distance to a middle axis of the toroidal core, which foot has a radial outer side formed like a radial inner side of the core and wherein legs of different adjustment members have different thicknesses in circumferential direction;
   wherein each leg has two flanges at the outer end, which flanges are attached to axial sides of the toroidal core, the axial sides facing in an axis direction of the toroidal core, wherein the flanges envelope an radial inner side and the axial sides of circumferential parts of the core, which are not covered by the phase windings, such that the outer end of each leg of the adjustment member overlays an axial side of the axial sides of the core for adjusting the differential mode inductance;
   selecting one of the several adjustment members to select a differential mode inductance; and
   attaching the selected adjustment member in a middle opening within the toroidal core, wherein the adjustment member is provided in two parts, which are plugged along the axis direction into the middle opening within the core.

* * * * *